United States Patent
Hoffmann et al.

(10) Patent No.: US 6,388,917 B2
(45) Date of Patent: May 14, 2002

(54) METHOD FOR NONDESTRUCTIVELY READING MEMORY CELLS OF AN MRAM MEMORY

(75) Inventors: Kurt Hoffmann, Taufkirchen; Oskar Kowarik, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/915,983

(22) Filed: Jul. 25, 2001

(30) Foreign Application Priority Data

Jul. 25, 2000 (DE) .......................... 100 36 140

(51) Int. Cl.[7] .............................. G11C 11/15
(52) U.S. Cl. .................. 365/158; 365/173; 365/171; 365/210
(58) Field of Search ................. 365/158, 173, 365/171, 148, 210, 207

(56) References Cited

U.S. PATENT DOCUMENTS

| | | | |
|---|---|---|---|
| 4,829,476 A | * 5/1989 | Dupuis et al. | 365/158 |
| 5,734,605 A | * 3/1998 | Zhu et al. | 365/173 |
| 5,930,164 A | * 7/1999 | Zhu | 365/158 |
| 5,986,858 A | * 11/1999 | Sato et al. | 360/113 |
| 6,055,178 A | 4/2000 | Naji | 365/158 |

* cited by examiner

Primary Examiner—Andrew Q. Tran
(74) Attorney, Agent, or Firm—Herbert L. Lerner; Laurence A. Greenberg; Werner H. Stemer

(57) ABSTRACT

A method for nondestructively reading memory cells of an MRAM memory, which includes steps of: determining a standard resistance of a memory cell at a voltage at which a resistance of the memory cell is independent of a stored content of the memory cell; determining an actual resistance of the memory cell at a voltage at which the resistance of the memory cell is dependent on the stored content of the memory cell; obtaining a normalized actual resistance of the memory cell by dividing the actual resistance by the standard resistance; obtaining a comparison result by comparing the normalized actual resistance with a reference value; and detecting the stored content of the memory cell dependent on the comparison result.

14 Claims, 6 Drawing Sheets

Fig. 9
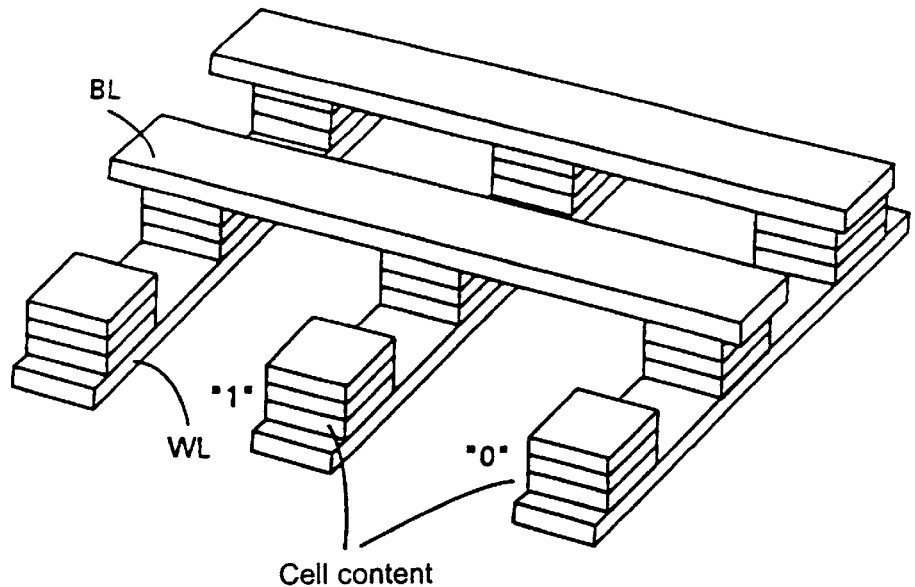
Cell content
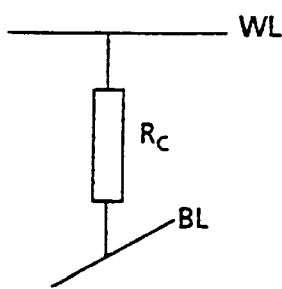
Fig. 10a
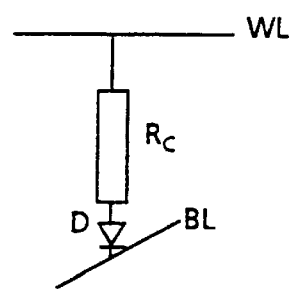
Fig. 10b
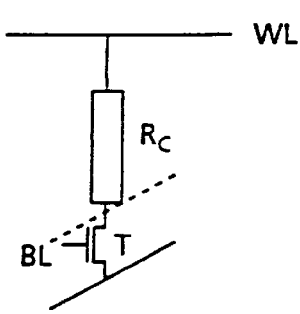
Fig. 10c
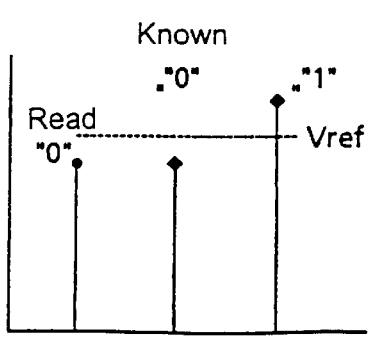
Fig. 11a
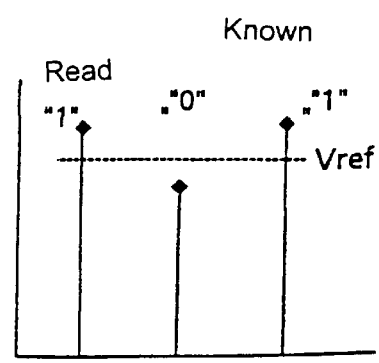
Fig. 11b

METHOD FOR NONDESTRUCTIVELY READING MEMORY CELLS OF AN MRAM MEMORY

BACKGROUND OF THE INVENTION

FIELD OF THE INVENTION

A memory cell of an MRAM (Magneto-Resistive Random Access Memory) is shown diagrammatically in FIG. 8. In such a memory cell, the information to be stored is stored by the nature of the orientation of the magnetic moments in adjacent magnetized layers ML1 and ML2, which are separated from one another by a very thin nonmagnetic intermediate layer TL, which is nonconductive. This is because the size of the electrical resistance across the memory cell depends on the parallel or antiparallel orientation of the magnetic moments in the magnetized layers ML1 and ML2, that is to say the polarization thereof. In the case of the parallel orientation of the magnetic moments in the two layers ML1 and ML2, the resistance of the memory cell is generally lower than in the case of their antiparallel orientation. This effect is also referred to as TMR effect (TMR= "tunneling magnetoresistive") or as MTJ effect (MTJ= "magnetic tunnel junction").

As a result, the memory content of the memory cell can be read out by detecting the resistance of the memory cell, the resistance being different for a "1" or "0". Parallel magnetization of the two layers ML1 and ML2 may be assigned to a digital zero, for example, in which case the antiparallel magnetization of these layers corresponds to a digital one.

The change in resistance between the parallel and the antiparallel orientation of the magnetic moments in the magnetized layers ML1 and ML2 is physically based on the interaction of the electron spins of the conduction electrons in the thin nonmagnetic intermediate layer TL with the magnetic moments in the magnetized layers ML1 and ML2 of the memory cell. In this case, "thin" is intended to express the fact that the conduction electrons can cross the intermediate layer TL without spin scattering processes.

Preferably, the magnetization of one of the two magnetized layers ML1 and ML2 is coupled to an antiferromagnetic support or covering layer, as a result of which the magnetization in this magnetized layer remains essentially fixed, while the magnetic moment of the other magnetized layer can be freely oriented even in the case of small magnetic fields, as are generated for instance by a current in a word line WL and a bit line BL above and below the magnetized layer.

In a memory cell array, programming currents $I_{WL}$ and $I_{BL}$ flowing through the word line WL and through the bit line BL, respectively, are chosen such that a magnetic field strong enough for programming prevails only in the cell in which the word line WL crosses the bit line BL, by virtue of the sum of the two currents $I_{WL}$ and $I_{BL}$, while all of the other memory cells present on this word line WL or this bit line BL cannot be reprogrammed by the current flowing only through one of these two lines.

FIG. 8B once again diagrammatically illustrates the resistance $R_c$ of the memory cell between a bit line BL and a word line WL. The resistance $R_c$ is larger for the antiparallel orientation of the magnetic moments in the layers ML1 and ML2 than for the parallel orientation of the magnetic moments, i.e. $R_c$ ("0") < $R_c$ ("1"), if the above assumption for the assignment of a "1" or a "0" is taken as a basis.

In their simplest embodiment, MRAMs include interconnects—crossing one another in a matrix form—of the word lines WL and of the bit lines BL, via which the memory cells are addressed. An upper interconnect, for example the bit line BL (cf. FIG. 8A), is in this case connected to the upper magnetized layer ML1, e.g. a ferromagnetic layer, while the lower interconnect, which forms the word line WL, bears against the lower magnetized layer ML2, which may likewise be a ferromagnetic layer. If a voltage is applied to the memory cell via the two interconnects for the word line WL and the bit line BL, then a tunneling current flows through the thin nonmagnetic intermediate layer TL. This thin nonmagnetic intermediate layer then forms the resistance $R_c$ (See FIG. 8B) which, depending on the parallel or the antiparallel orientation of the magnetic moments, that is to say the parallel or the antiparallel polarization of the upper and lower ferromagnetic layers, given a suitable voltage across the memory cell, assumes the magnitude $R_c$("0") < $R_c$("1") or $R_c$("1")=$R_c$("0")+$\Delta R_c$.

FIG. 9 shows a memory cell array in which memory cells are configured like a matrix at crossover points between word lines WL and bit lines BL.

The cell content is indicated diagrammatically here depending on the antiparallel or parallel polarization as a "1" or a "0" for two memory cells.

In a memory cell array as shown diagrammatically in FIG. 9, not only does a current flow via the memory cell at the crossover point between a selected word line WL and a selected bit line BL, but undesirable shunt currents also occur at further memory cells which are respectively connected to the selected word line WL and the selected bit line BL. These undesirable shunt currents interfere to a considerable extent with the read current which flows through the selected memory cell.

Therefore, efforts have already been made to use suitable circuitry of the memory cell array to largely separate such undesirable shunt currents from the read current, so that only the read current through the selected memory cell or the read voltage across the memory cell is available for detection. In this case, however, because of the parasitic currents flowing through the other memory cells, the resistance of the memory cells must be chosen to be high, in particular in the Mohm range, in order to be able to construct sufficiently large memory cell arrays.

Another way of avoiding the undesirable shunt currents is to augment the inherently simply constructed MTJ memory cell (cf. FIG. 10a) with a diode D (cf. FIG. 10b) or with a switching transistor T (cf. FIG. 10c) (R. Scheuerlain et al., "A 10 ns Read and Write Time Non-Volatile Memory Array Using a Magnetic Tunnel Junction and FET-Switch in each Cell", ISSCC February. 2000 p. 128/R.c. Sousa et al., "Vertical Integration of a spin dependent tunnel junction with an amorphous Si diode", appl. Phys. Letter Vol. 74, No. 25, pp. 3893 to 3895).

The advantage of such augmentation by a diode or a switching transistor is that, in the memory cell array, given suitable circuitry, a read current only flows through the memory cell that is respectively read, since all of the remaining memory cells are inhibited. The resistance of the memory cell can then be chosen to be lower in contrast to a pure MTJ cell in accordance with FIG. 10a, as a result of which the read current becomes relatively large and the read-out can take place rapidly in the ns range. Such additional circuitry with a diode or a transistor has the disadvantage, however, that it causes considerable additional technological and areal outlay.

In the current state of the art, it is a common feature of all memory cell types that it is very difficult to detect or evaluate a read signal as "0" or "1" since the tunneling resistance formed by the layer sequence of the layers ML1, TL and ML2 generally fluctuates, not only over a wafer but even in many cases between adjacent memory cells, to a much greater extent, i.e. up to 40%, than the difference in the resistance $\Delta R_c$ between a "1" state and a "0" state, which is just 15%, for example. In other words, these conditions make it considerably more difficult or even impossible to reliably detect the content of a memory cell.

In other memory types that differ from MRAMs, a "1" or a "0" is detected from a current or a voltage read signal by comparing the read signal with either a reference current or a reference voltage, which should have a value midway between the read current or the read voltage for a "1" and the read current or the read voltage for a "0" in order to achieve the best signal-to-noise ratio in each case for both digital values. The reference current or the reference voltage can be generated by means of reference sources or, alternatively, by means of reference cells to which a "1" and a "0" have been permanently written.

However, such a procedure can be used at best in a limited fashion, if at all, for detecting the read signal in an MTJ cell. This is attributable to the great fluctuation—outlined in the introduction—of the tunneling resistance from memory cell to memory cell and over the entire wafer.

To date, there have been only two approaches for solving the problems evinced above:

A first approach (in this respect, cf. R. Scheuerlain et al. "A 10 ns Read and Write Time Non-volatile Memory Array Using a Magnetic Tunnel Junction and FET-Switch in each Cell", ISSCC February. 2000, p. 128) is suitable for MTJ cells with a switching transistor (cf. FIG. 10c) and consists in using two adjacent complementary memory cells for storing only one cell content. It always being the case that the memory content is written to the first memory cell and the complement of the memory content, that is to say the inverted memory content, is written to the second memory cell. During read-out, both memory cells are read and the contents are detected. In this case, the read signal and the signal-to-noise ratio are twice as large as in the customary reference method explained above. However, the space requirement and the technological outlay for two memory cells and two switching transistors are also very large, and it must be ensured that the resistance fluctuations between the two adjacent complementary cells are so small that reliable detection can be effected.

This precondition is not necessary in the second approach, which is based on self-referencing of a read pure MTJ memory cell (cf. FIG. 10a). In this case, the procedure is as follows:

Firstly, the cell content of a selected memory cell is read out and stored. A "0", for example, is then programmed into this memory cell. The content of the programmed-in "0" of the memory cell is then read out and stored. The cell content stored first is compared with the stored known "0" and detected, and the cell content thus detected is written back to the memory cell again.

What is disadvantageous about such a procedure is, then, that during the detection of the read signal, a predefined half read signal has to be added to the "0" that is programmed in as a reference and read out again, as a result of which resistance fluctuations once again enter into the detection of the memory cell.

In the second approach, then, in order to be totally independent of resistance fluctuations of the memory cells, the method just explained has to be completed by writing in a "1". The following method sequence is then present:

(a) The cell content of a selected memory cell is read and stored.

(b) A "0", for example, is programmed into the memory cells.

(c) The content of the programmed-in "0" of the memory cell is read and stored.

(d) A "1", for example, is programmed into the memory cell.

(e) The content of the programmed-in "1" of the memory cell is read and stored.

(f) The stored cell content from (a) is compared with the stored quantity "1" and "0" from (c) and (e) and is detected. This is effected by forming a reference voltage Vref from the known "0" and "1". only half of the read signal difference is available in each case for detecting the read "1" or "0", as is indicated for a read "0" in FIG. 11a and for a read "1" in FIG. 11b.

(g) Finally, the detected cell content is written back to the memory cell again. Through the written-in and read "1" and "0", the method according to the second approach generates the reference voltage in the selected memory cell itself, so that resistance fluctuations from memory cell to memory cell do not influence the detection. However, the signal-to-noise ratio of a "1" or of a "0" is only half as large as in the first-described method of the complementary cells according to the first approach. The considerable disadvantage of the method according to the second approach is that a total of three read cycles and three write cycles and also an evaluation cycle are required, as a result of which the read operation becomes very slow.

To summarize, it can thus be stated that twice the space requirement and small resistance fluctuations between adjacent memory cells are required in the first approach, while the second approach, with a total of seven cycles, demands a considerable amount of time for a read operation.

SUMMARY OF THE INVENTION

It is accordingly an object of the invention to provide a method for nondestructively reading memory cells of an MRAM memory which overcomes the above-mentioned disadvantageous of the prior art apparatus and methods of this general type. In particular, it is an object of the invention, to provide such a method that has a small space requirement and that requires less time for each read operation.

With the foregoing and other objects in view there is provided, in accordance with the invention a method for nondestructively reading memory cells of an MRAM memory, which includes steps of: determining a standard resistance of a memory cell at a voltage at which a resistance of the memory cell is independent of a stored content of the memory cell; determining an actual resistance of the memory cell at a voltage at which the resistance of the memory cell is dependent on the stored content of the memory cell; obtaining a normalized actual resistance of the memory cell by dividing the actual resistance by the standard resistance; obtaining a comparison result by comparing the normalized actual resistance with a reference value; and detecting the stored content of the memory cell dependent on the comparison result.

The method may be more easily understood in reference to the following somewhat repetitive description in which reference is made to formulas. In other words the method includes steps of:

(a) determining a standard resistance Rstandard of a memory cell at a voltage at which the resistance of the memory cell is independent of the cell content thereof;

(b) determining the actual resistance R(0) or R(1) of the memory cell at a voltage at which the resistance of the memory cell is dependent on the cell content thereof;

(c) normalizing the actual resistance using the standard resistance by forming $$R\text{standard}(\mathbf{0}) = R(\mathbf{0})/R\text{standard}$$

or $$R\text{standard}(\mathbf{1}) = R(\mathbf{1})/R\text{standard};$$

(d) comparing Rstandard(0) or Rstandard(1) with a normalized reference resistance:

$$R\text{standardref} = (R\text{standard}(\mathbf{0})\text{ref} + R\text{standard}(\mathbf{1})\text{ref})/2$$

and (e) detecting the memory cell content as a 0 or as a 1 in a manner dependent on the comparison result.

The method and a configuration that is utilized when performing the method thus exploit a property of MTJ memory cells to which hardly any attention has been given heretofore. Specifically, the value of the tunneling resistance of a memory cell is dependent on the voltage across the memory cell. In this case, there are voltage ranges in which the tunneling resistance has the same magnitude, that is to say is of the same magnitude for a "1" and a "0", independently of the directions of the polarizations in the two magnetized layers. In other voltage ranges, by contrast, in the case of antiparallel orientation of the polarization in the two magnetized layers, the resistance is larger by $\Delta R$ than in the case of parallel orientation of the polarization in these layers, so that the cell content can in this case be differentiated according to "0" and "1" at this voltage.

The method is based on the fact that in the voltage range mentioned first, which shall be designated by U1, the resistance $R_c$ of the memory cell can be determined independently of the content of the memory cell, while in the voltage range mentioned second, which shall be indicated by U2, the resistance $R_c$ can be detected depending on the cell content. It is thus possible to normalize the resistance $R_c(U2)$ dependent on the cell content by means of the resistance $R_c(U1)$ independent of the cell content such that the content of different memory cells, which need not be adjacent, can be compared with one another again. As a result, it is also possible to compare the normalized read signal of an addressed memory cell with a normalized reference signal of a reference cell to which in each case a "0" or a "1" is always written, and thus to detect the content of the memory cell as "1" or "0".

In accordance with an added feature of the invention, the method includes: storing the standard resistance of the memory cell in a transistor circuit; and connecting the memory cell to the transistor circuit.

In accordance with an additional feature of the invention, the method includes: providing an amplifier having an output; and using a switch to connect the transistor circuit to the output or the amplifier.

In accordance with another feature of the invention, the method includes: defining the amplifier as a first amplifier having a first input; providing a second amplifier having an output and a first input; connecting the first input of the first amplifier to the output of the second amplifier; and connecting the first input of the second amplifier to the memory cell.

In accordance with a further feature of the invention, the method includes: providing the first amplifier with a second input and supplying the second input of the first amplifier with a first fixed voltage; and providing the second amplifier with a second input and supplying the second input of the second amplifier with a second fixed voltage.

In accordance with a further added feature of the invention, the method includes: providing the transistor circuit with two transistors having source-drain paths that are connected in parallel; and locating the two transistors between the memory cell and an output.

In accordance with a concomitant feature of the invention, the method includes: providing the two transistors with gate terminals; and connecting the gate terminals to a switch and to a storage capacitor.

Other features which are considered as characteristic for the invention are set forth in the appended claims.

Although the invention is illustrated and described herein as embodied in a method for the nondestructive reading of memory cells of an MRAM memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9 shows a schematic illustration of the cell architecture for an MTJ memory cell;

FIGS. 10a to 10c show equivalent circuit diagrams of an MTJ memory cell, an MTJ memory cell with a diode, and an MTJ memory cell with a transistor; and FIGS. 11a and 11b show schematic illustrations for elucidating the detection of a "0" and of a "1" in a known method.

DESCRIPTION OF THE PREFERRED EMBODIMENTS

Figure 1:
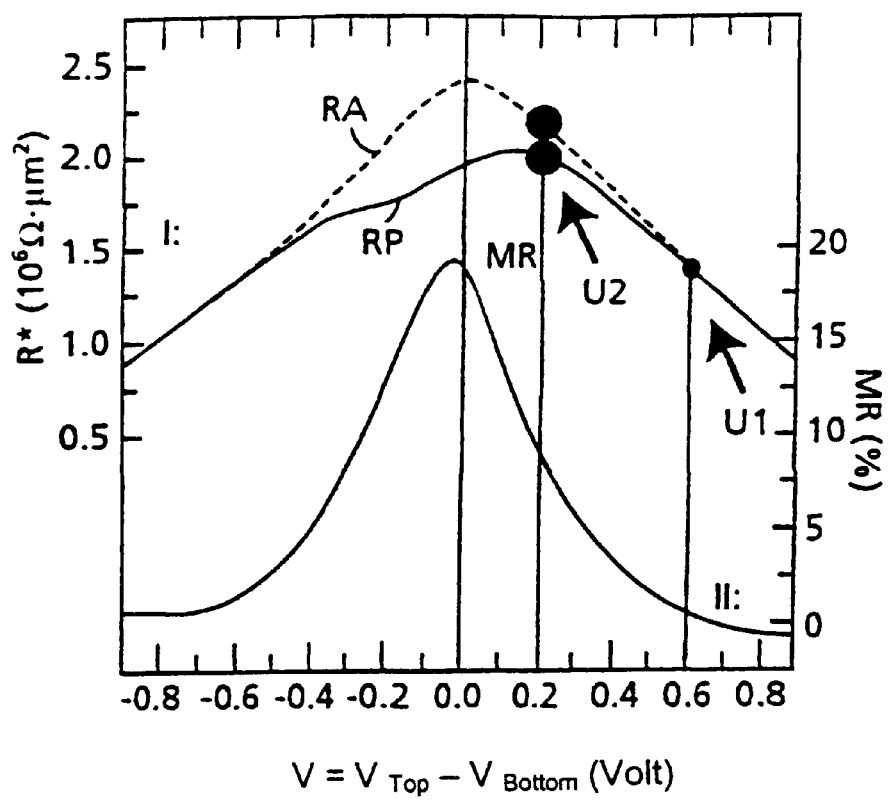
FIG. 1 shows the dependence of the tunneling resistance for parallel (RP) and antiparallel (PA) polarization of the magnetized layers of a memory cell as a function of the voltage applied to the memory cell, $V = V_{top} - V_{bottom}$, in curves I and the resistance ratio $MR = (RA - RP)/RP$ in a curve II.
Figure 8A:
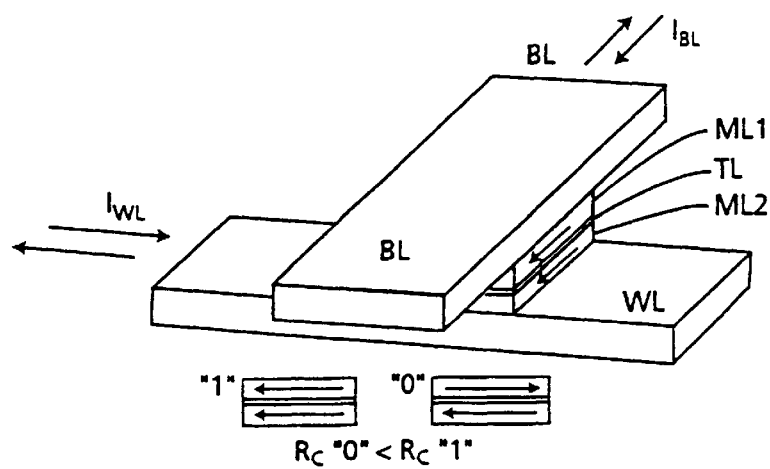
FIG. 8A shows a schematic illustration of an MTJ memory cell.
Figure 8B:
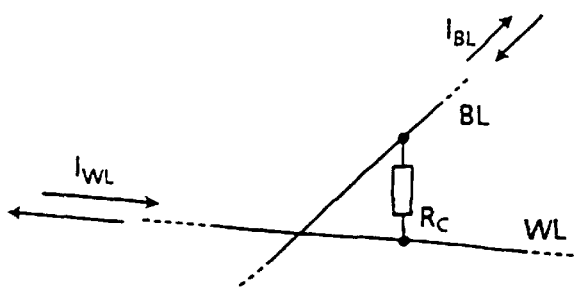
FIG. 8B shows with an equivalent circuit diagram of the MTJ memory cell shown in FIG. 8A.

Referring now to the figures of the drawing in detail and first, particularly, to FIG. 1 thereof, there is shown the sheet resistance value R* of the tunneling resistance of a memory cell as a function of the voltage applied to the memory cell, $V=V_{top}-V_{bottom}$, where $V_{top}$ is present, for example, on the bit line BL and $V_{bottom}$ is present on the word line WL (cf. FIGS. 8A and 8B). In a voltage range between about −0.6 V and +0.6 V, the resistance RA given antiparallel polarization of the magnetized layers is greater than the resistance RP given parallel polarization of the layers. By contrast, in voltage ranges between −1.0 V and −0.6 V and between 0.6 V and 1.0 V, the resistances for antiparallel polarization and parallel polarization of the magnetized layers have approximately the same magnitude. For a voltage U2=0.2 V, RA is thus greater than RP, while for a voltage U1=0.6 V, approximately RP (U1)=RA (U1) holds true. For U2, by contrast, RA (U2)=RP (U2)+ΔR holds true.

In other words, at the voltage U2 it is possible to detect the content of a memory cell, whereas when the voltage U1 is applied, a resistance which is identical for parallel and antiparallel polarization of the magnetized layers is obtained, which resistance can be used for normalizing the resistance of the memory cell.

The method is based, in principle, on the fact that, at the voltage U1, the resistance $R_c(U1)$ of the memory cell can be determined independently of the cell content, while at the voltage U2, the resistance $R_c(U2)$ of the memory cell can be detected depending on the cell content. This means that it is possible to normalize the resistance $R_c(U2)$ dependent on the cell content by means of the resistance $R_c(U1)$ that is independent of the cell content. That is to say to form $R_c(U2)/R_c(U1)$, so that the cell content of different memory cells, which need not be adjacent to one another, can be compared with one another again. The method thus makes it possible to compare the normalized read signal of an addressed memory cell with normalized reference signals of, for example, reference memory cells to which in each case a "0" and a "1" are always written, so that the cell content of the addressed memory cell can be detected as "1" or "0".

Figure 2:
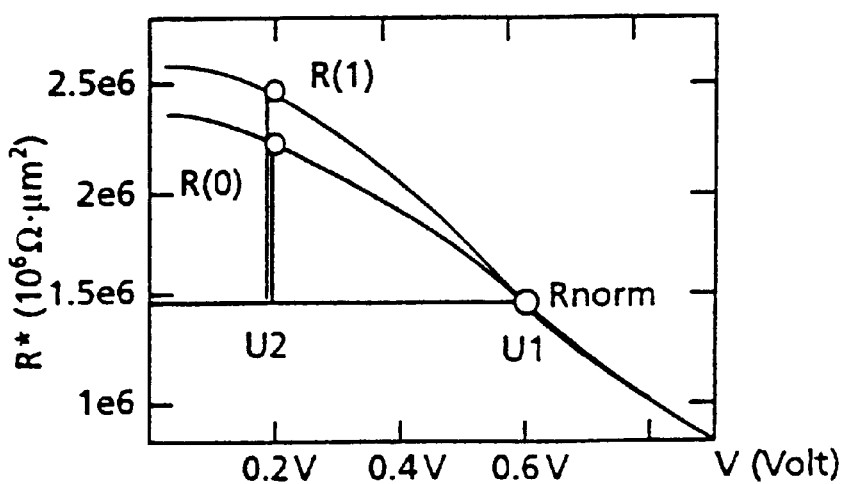
FIG. 2 shows a schematic illustration for further elucidating the dependence of the resistance of a memory cell on the voltage across the memory cell, in this case the sheet resistance is plotted as a function of the contact voltage.

This operation will be explained again in more detail with reference to FIG. 2, in which the sheet resistance R* is again plotted as a function of the contact voltage V.

First, the standard resistance Rstandard is determined at the voltage U1=0.6 V, for example, and is stored. Following, at the voltage U2=0.2 V, the cell content is defined with the resistance R(0) and R(1) depending on the antiparallel (R(1)) and parallel (R(0)) polarization of the magnetized layers. Following, R(0) and R(1) are normalized to Rstandard, i.e. Rstandard(0)=R(0)/Rstandard and Rstandard (1)=R(1)/Rstandard are formed. This is followed by comparing Rstandard(0) and Rstandard(1) with a reference resistance Rstandardref=(Rstandard(0)ref+Rstandard(1)ref) /2 of a reference memory cell, which has previously been defined. Finally, the cell content is detected as "0" or "1" as a result of this comparison.

As will be explained in more detail further below using the exemplary embodiment of FIG. 3, the method can be implemented in two time steps for the voltages U1 and U2.

Thus, the method provides, in particular, the following advantages:

The method can be carried out independently of the variation of the resistances of memory cells. Its execution requires only two time steps. The normalization of the read signal enables a comparison with external reference signals. It is thus superior in every respect to the existing methods explained in the introduction. Finally, the inventive method can be applied to all types of the various MTJ memory cells, that is to say to pure MTJ memory cells, to MTJ memory cells with diodes, and MTJ memory cells with transistors.

Figure 3:
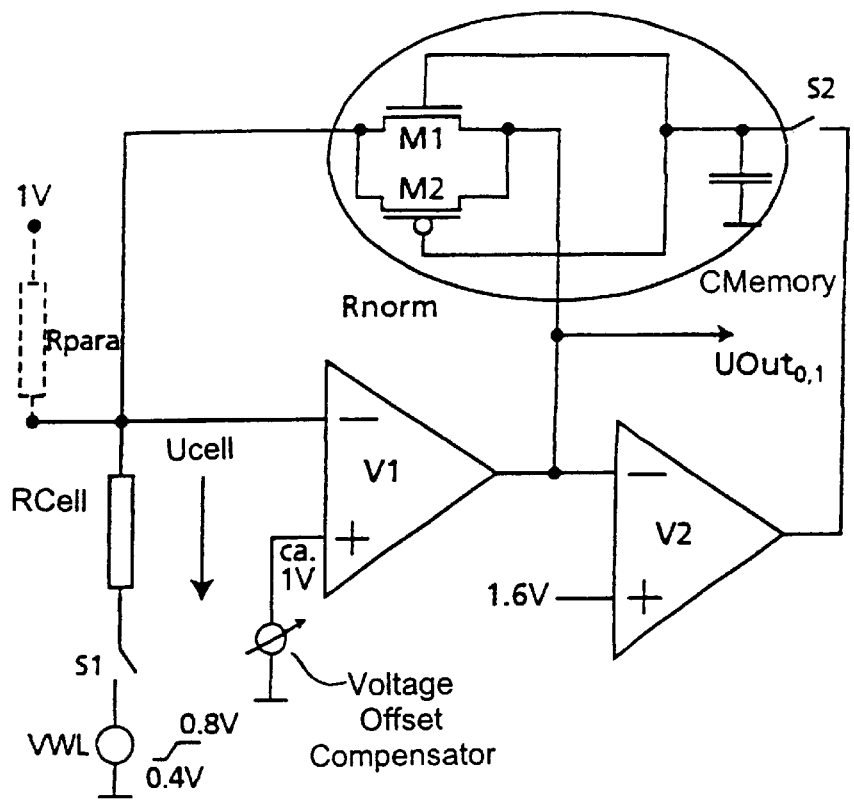
FIG. 3 shows a schematic circuit diagram for an exemplary embodiment of a basic circuit for normalizing a read signal.

FIG. 3 shows an exemplary embodiment of a configuration for carrying out the inventive method. This configuration enables, in principle, the normalization of a read signal. The configuration has, in particular, a memory cell with a resistance Rcell, which is connected via a switch S1, for example a transistor, to a word line voltage VWL of 0.4 V or 0.8 V. A first differential amplifier V1 has a negative input that is connected to the end of the resistance Rcell which is opposite to the switch S1. The first differential amplifier V1 has a positive input connected to a voltage of, for example, about 1 V. A second differential amplifier V2 has a negative input that is connected to the output of the first differential amplifier V1 and has a positive input connected to a voltage of 1.6 V. A p-channel MOS field-effect transistor, a storage capacitor Cmemory, and also a further switch S2 are shown. An n-channel MOS field-effect transistor M1 is additionally shown in FIG. 3 (and FIGS. 4a to 4c). If this field-effect transistor M1 is used instead of the field-effect transistor M2, then the (+) and (−) inputs of the second differential amplifier $V_2$ must be interchanged.

It is assumed below that only the transistor M2 is present, while the transistor M1 is not provided.

The circuit including the two transistors M1 and M2, the storage capacitor Cmemory and the isolating switch S2 serves for buffer storing the normalization resistance Rstandard= Rcell(U1).

Parasitic resistances Rpara of other memory cells are additionally represented by broken lines. The voltage of 1 V (positive) as an "offset" compensation is present at the positive (+) input of the first amplifier V1 in such a way that 0 V are dropped between the positive input and the negative (−) input of the amplifier V1. In other words, exactly 1 V is present at the negative input of the first amplifier V1. The remaining lines of the memory cell array with the exception of the selected lines are also at 1 V, for example.

At the positive input of the second amplifier V2, the voltage is prescribed such that the voltage at the output of the first amplifier V1 reaches the voltage at the negative input of the first amplifier V1. That is to say 1 V for example, plus the voltage Ucell dropped across Rcell, that is to say 0.6 V for example, which is present for determining the normalization resistance Rstandard across the addressed memory cell. In other words, 1 V+0.6 V=1.6 V, for example, are present at the positive input of the second amplifier V2.

The effect achieved by these voltage specifications is that the second amplifier V2 drives transistor M2 with switch S2 closed in such a way that exactly the same voltage of 0.6 V, for example, is dropped across the transistor M2 as is dropped across the memory cell. In other words, the voltage Ucell is likewise present across the transistor.

As a result, the same current flows through the transistor M2 as flows through the memory cell. In other words, the transistor M2 simulates the normalization resistance Rstandard. If the switch S2 is then opened, the resistance Rstandard remains stored in the transistor M2 or in the storage capacitor Cmemory.

By applying a voltage other than 1.6 V to the positive input of the second amplifier V2, such as, for example, by applying 1.3 V to the input, it is possible to adjust the gain of the first amplifier V1, which is a feedback amplifier, to for example, a double gain at 1.3 V.

The method of operation of the circuit configuration of FIG. 3 can be summarized as follows using the voltage values of the example of FIG. 2:

First, the word line shall be at 1 V, so that VWL=1 V is present. The switches S1 and S2 are closed, so that 1 V is thus present on all of the lines of the memory cell array. At the negative input of the first amplifier V1, 1 V shall likewise be present for the purpose of "offset" compensation.

Figure 4A:
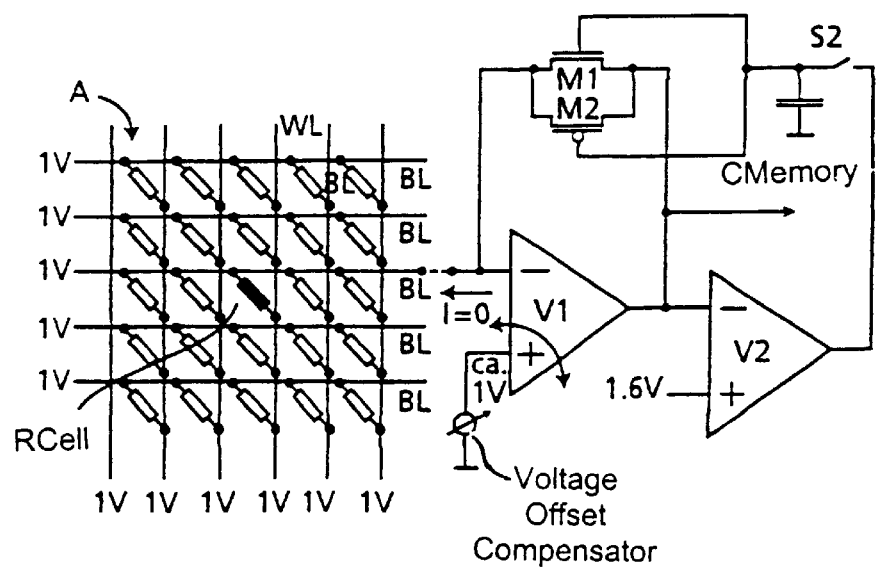
FIGS. 4a to 4c show schematic circuit diagrams for elucidating the sequence of the self-normalizing method using the example of a memory cell array with MTJ memory cells.

This state in which a current I=0 flows into a memory cell array A including m×n MTJ memory cells is illustrated in FIG. 4a.

A voltage UWL1=0.4 V is then applied to the word lines, so that the voltage dropped across the resistance Rcell of a memory cell is 1 V (bit line)–0.4 V (word line)=0.6 V=U1. The second amplifier V2 regulates the transistor M2 in such a way that exactly 0.6 V is likewise dropped across the transistor. A current $I_{Rcell}$ through the memory cell is thus equal to the current through the transistor M2, so that Rcell (U1=0.6 V)=$R_{M2}'$=Rstandard is present. The switch S2 is then opened, as a result of which Rstandard is stored in the transistor M2 and also in the storage capacitor Cmemory.

Figure 4B:
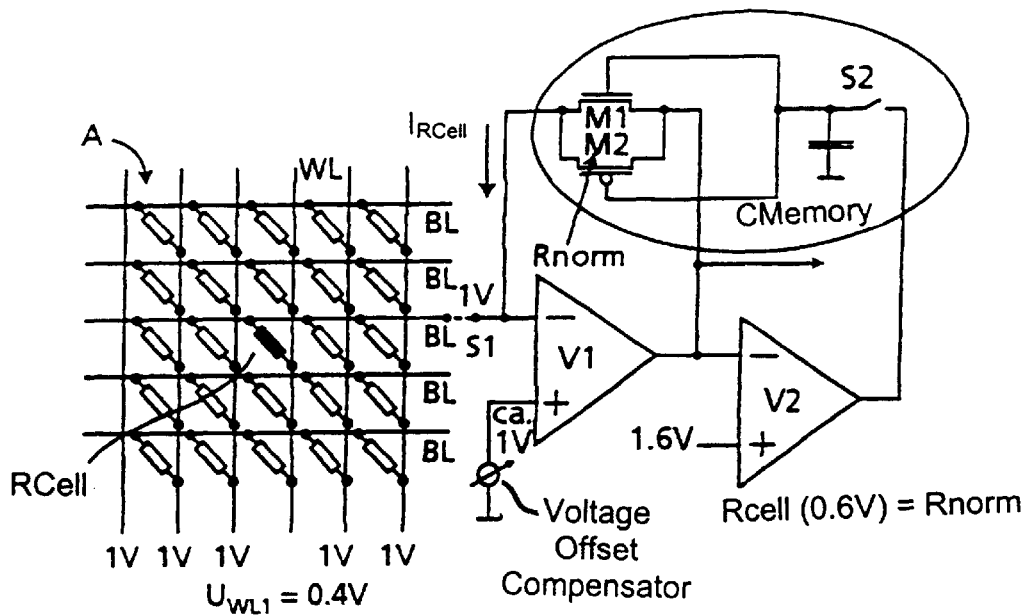

The state that has now been reached is shown schematically in FIG. 4b.

The word line is now brought to a voltage of 0.8 V, for example, so that $U_{WL2}$=0.8 V is present. The voltage across the resistance Rcell of a memory cell is then 1.0 V (bit line) –0.8 V (word line)=0.2 V. The first amplifier V1 thus supplies a normalized read signal $Uout_{0,1}$=1 V+U2 (Rstandard/$Rcell_{0,1}$).

Figure 4C:
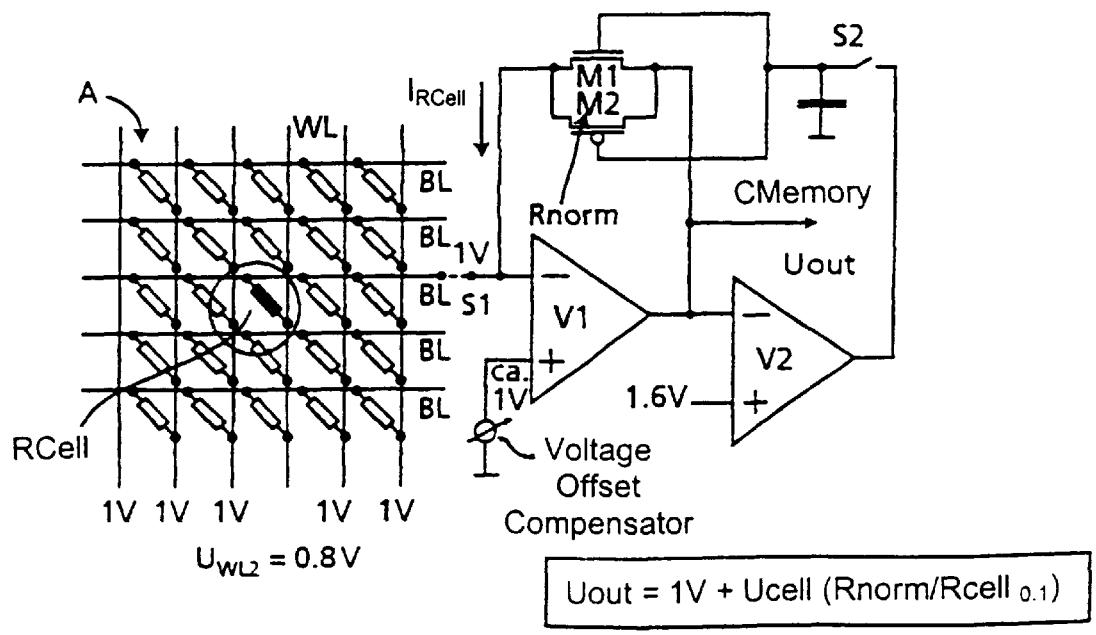

The state that has now been reached is illustrated in FIG. 4c.

Finally, $Uout_{0,1}$ is compared with a reference voltage and detected as "1" or "0" signal.

Figure 5:
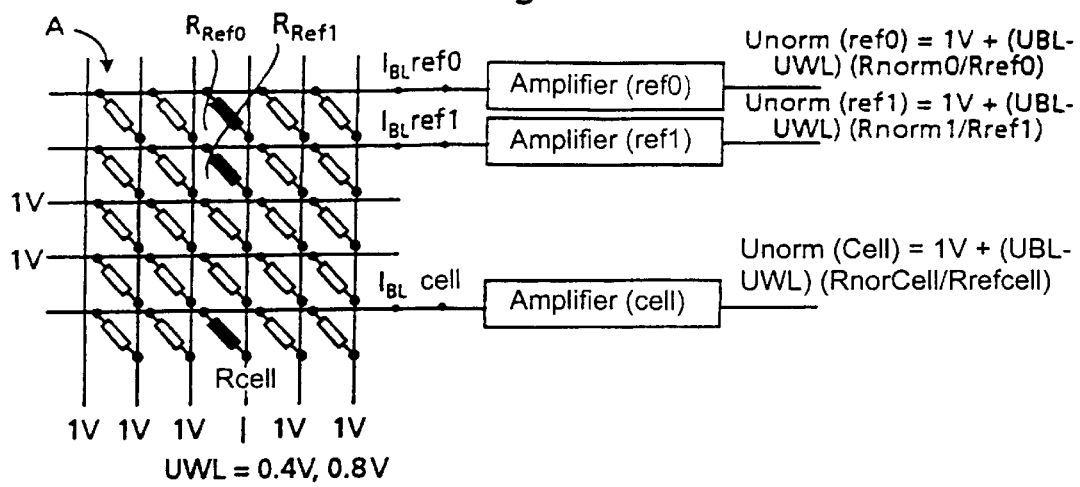
FIG. 5 shows a schematic circuit diagram for elucidating the referencing of a normalized read signal by means of normalized reference signals for "1" and "0"

FIG. 5 shows an example of a circuit configuration for possible referencing of a read signal with the aid of reference cells $R_{ref0}$ and $R_{ref1}$, to which respectively a "0" and a "1" are permanently written. In this case, the same voltage UWL as applied to the cell $R_{cell}$ to be read is applied to the reference cell $R_{ref1}$, to which a "1" was previously written, and to the reference cell $R_{ref0}$, to which a "0" was previously written. In this case, the reference cells $R_{ref0}$ and $R_{ref1}$ and the cell $R_{cell}$ to be read are respectively connected to an amplifier "amplifier(ref1)", an amplifier "amplifier(ref0)" and an amplifier "amplifier(cell)", in order in each case to generate a normalized signal Ustandard(ref1), Ustandard (ref0) and Ustandard(cell). Ustandard(ref1)=1 V+(UBL– UWL) * (Rstandard1/Rref1), Ustandard(ref0)=1 V+(UBL– UWL) * (Rstandard0/Rref0) and Ustandard(cell)=1 V+(UBL –UWL) * (Rstandardcell/Rrefcell). By comparing the normalized cell signal with the reference signal obtained from the normalized reference cell signals Ustandard(ref0) and Ustandard(ref1), Ustandardref=(Ustandard(ref0)+ Ustandard(ref1))/2, it is then possible, as is shown in FIG. 6, to detect the cell content of the cell Rcell in the memory array A in an evaluation step.

Figure 6:
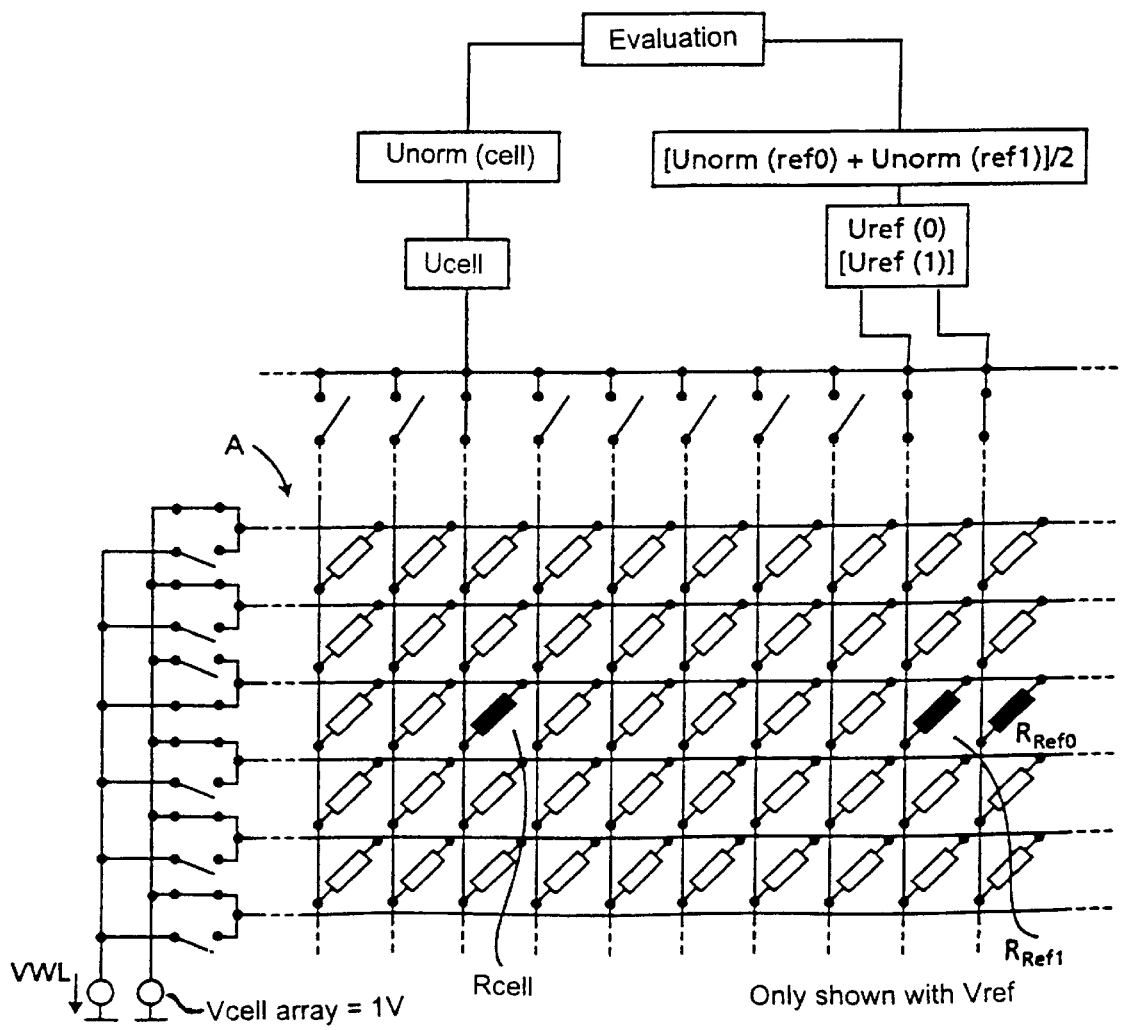
FIG. 6 shows a schematic circuit diagram for elucidating the implementation of self-normalized detection of a cell signal.
Figure 7:
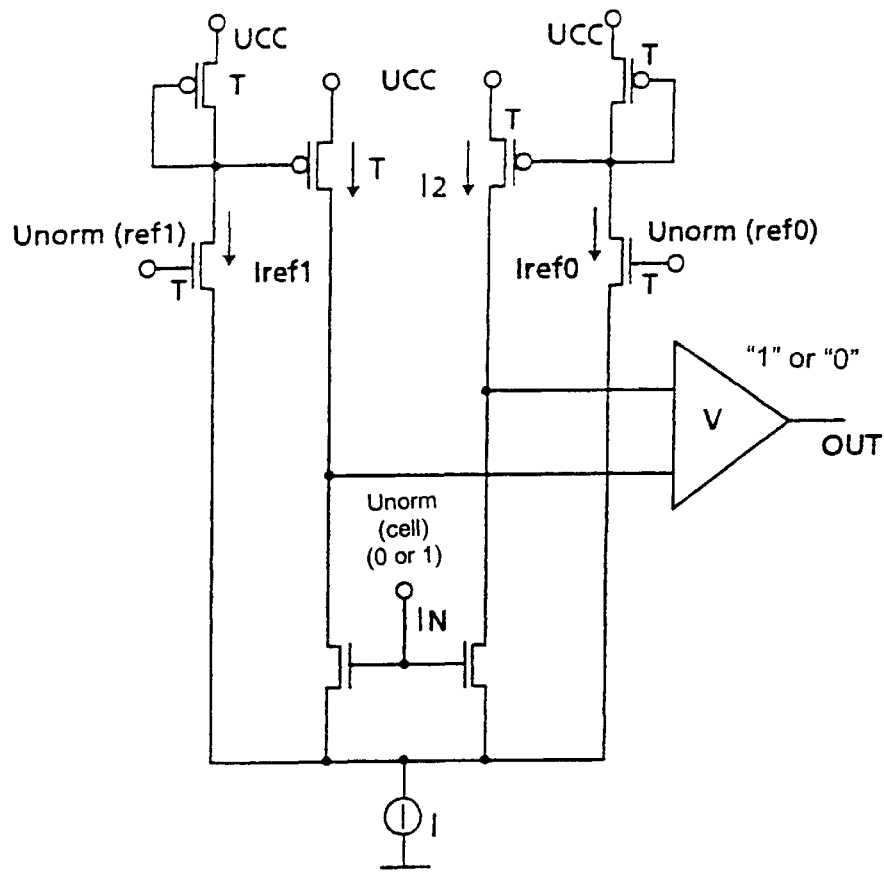
FIG. 7 shows a concrete circuit for detecting the cell signal.

Finally, FIG. 7 illustrates an example of a possible evaluation circuit which performs the evaluation in FIG. 6. In this case, transistors T of this circuit are to be dimensioned such that a "1" or a "0" is indicated at an output OUT of the evaluation circuit depending on the content stored in a memory cell.

In this case, the evaluation circuit shown in FIG. 7 is connected between supply voltages UCC and a current source I. The cell content Ustandard(cell) is fed to this evaluation circuit at an input IN and compared with (Ustandard(ref0)+Ustandard(ref1))/2 and is output via an amplifier V to the output OUT.

We claim:

1. A method for nondestructively reading memory cells of an MRAM memory, which comprises:
   determining a standard resistance of a memory cell at a voltage at which a resistance of the memory cell is independent of a stored content of the memory cell;
   determining an actual resistance of the memory cell at a voltage at which the resistance of the memory cell is dependent on the stored content of the memory cell;
   obtaining a normalized actual resistance of the memory cell by dividing the actual resistance by the standard resistance;
   obtaining a comparison result by comparing the normalized actual resistance with a reference value; and
   detecting the stored content of the memory cell dependent on the comparison result.

2. The method according to claim 1, which comprises:
   determining a standard resistance of a reference memory cell at a voltage at which a resistance of the reference memory cell is independent of a stored content of the reference memory cell;
   storing a logic 1 in the reference memory cell and determining a first actual resistance of the reference memory cell at a voltage at which the resistance of the reference memory cell is dependent on the logic 1 stored in the reference memory cell;
   storing a logic 0 in the reference memory cell and determining a second actual resistance of the reference memory cell at a voltage at which the resistance of the reference memory cell is dependent on the logic 1 stored in the reference memory cell;
   obtaining a first normalized actual resistance of the reference memory cell by dividing the first actual resistance of the reference memory cell by the standard resistance of the reference memory cell;
   obtaining a second normalized actual resistance of the reference memory cell by dividing the second actual resistance of the reference memory cell by the standard resistance of the reference memory cell;
   adding the first normalized actual resistance of the reference memory cell and the second normalized actual resistance of the reference memory cell to obtain a result and dividing the result by two to obtain a normalized reference resistance; and
   using the normalized reference resistance as the reference value in performing the step of obtaining the comparison result.

3. The method according to claim 2, which comprises using a voltage of between 0.6 V and 0.8 V as the voltage at which the resistance of the memory cell is independent of the stored content of the memory cell.

4. The method according to claim 1, which comprises using a voltage of between 0.6 V and 0.8 V as the voltage at which the resistance of the memory cell is independent of the stored content of the memory cell.

5. The method according to claim 1, which comprises using a voltage of approximately 0.2 V as the voltage at which the resistance of the memory cell is dependent on the stored content of the memory cell.

6. The method according to claim 1, wherein the stored content of the memory cell is a logic 1 when the step of etermining the actual resistance of the memory cell is performed.

7. The method according to claim 1, wherein the stored content of the memory cell is a logic 0 when the step of determining the actual resistance of the memory cell is performed.

8. The method according to claim 1, which comprises:

storing the standard resistance of the memory cell in a transistor circuit; and connecting the memory cell to the transistor circuit.

9. The method according to claim 8, which comprises:

providing an amplifier having an output; and using a switch to connect the transistor circuit to the output of the amplifier.

10. The method according to claim 9, which comprises:

defining the amplifier as a first amplifier having a first input;

providing a second amplifier having an output and a first input;

connecting the first input of the first amplifier to the output of the second amplifier; and connecting the first input of the second amplifier to the memory cell.

11. The method according to claim 8, which comprises:

providing a first amplifier having a first input;

providing a second amplifier having an output and a first input;

connecting the first input of the first amplifier to the output of the second amplifier; and connecting the first input of the second amplifier to the memory cell.

12. The method according to claim 11, which comprises:

providing the first amplifier with a second input and supplying the second input of the first amplifier with a first fixed voltage; and providing the second amplifier with a second input and supplying the second input of the second amplifier with a second fixed voltage.

13. The method according to claim 8, which comprises:

providing the transistor circuit with two transistors having source-drain paths that are connected in parallel; and locating the two transistors between the memory cell and an output.

14. The method according to claim 13, which comprises:

providing the two transistors with gate terminals; and connecting the gate terminals to a switch and to a storage capacitor.

* * * * *